United States Patent
Yoshimura et al.

(10) Patent No.: US 10,173,606 B2
(45) Date of Patent: Jan. 8, 2019

(54) STRUCTURE FOR ATTACHING IN-VEHICLE APPARATUS

(71) Applicant: MAZDA MOTOR CORPORATION, Hiroshima (JP)

(72) Inventors: Toshiteru Yoshimura, Hiroshima (JP); Yasuhiro Hidaka, Hiroshima (JP); Masaki Matsumoto, Hiroshima (JP); Masato Sadano, Hiroshima (JP); Masao Tanimoto, Kure (JP); Takashi Fukumaru, Kure (JP); Keizo Takahashi, Hiroshima (JP)

(73) Assignee: MAZDA MOTOR CORPORATION, Hiroshima (JP)

( * ) Notice: Subject to any disclaimer, the term of this patent is extended or adjusted under 35 U.S.C. 154(b) by 0 days.

(21) Appl. No.: 15/507,499

(22) PCT Filed: Dec. 9, 2015

(86) PCT No.: PCT/JP2015/006146
§ 371 (c)(1),
(2) Date: Feb. 28, 2017

(87) PCT Pub. No.: WO2016/092846
PCT Pub. Date: Jun. 16, 2016

(65) Prior Publication Data
US 2017/0282812 A1 Oct. 5, 2017

(30) Foreign Application Priority Data

Dec. 10, 2014 (JP) ................................. 2014-250032

(51) Int. Cl.
*H05K 5/00* (2006.01)
*B60R 11/02* (2006.01)
(Continued)

(52) U.S. Cl.
CPC ...... *B60R 11/0229* (2013.01); *B60R 11/0235* (2013.01); *H05K 5/0017* (2013.01); *H05K 5/0204* (2013.01); *B60R 2011/0005* (2013.01)

(58) Field of Classification Search
CPC ................ H05K 5/0017; H05K 5/0204; B60R 11/0229; B60R 2011/0005; B60R 11/0235; G06F 1/1632; G06F 1/1654
See application file for complete search history.

(56) References Cited

U.S. PATENT DOCUMENTS 6,354,649 B1 * 3/2002 Lee .................. B60K 37/02
185/39
8,910,990 B1 * 12/2014 Oldani ................ B60R 11/02
220/260
(Continued)

FOREIGN PATENT DOCUMENTS

CN 103802672 A 5/2014
JP 2004-276812 A 10/2004
(Continued)

OTHER PUBLICATIONS

International Search Report issued in PCT/JP2015/006146; dated Feb. 16, 2016.

*Primary Examiner* — Hoa C Nguyen
*Assistant Examiner* — Christopher L Augustin
(74) *Attorney, Agent, or Firm* — Studebaker & Brackett PC

(57) ABSTRACT

A structure is for attaching an in-vehicle device including a display 20 standing on a dashboard 1 of a vehicle, and a controller 30 placed inside the dashboard 1. The structure includes a connecting bracket 40. The controller 30 is fixed to the dashboard 1. The controller 30 and the display 20 are connected together via the connecting bracket 40. The
(Continued)

connecting bracket 40 is attachable to and detachable from the controller 30 and the display 20 independently.

6 Claims, 11 Drawing Sheets

(51) Int. Cl.
  *H05K 5/02* (2006.01)
  *B60R 11/00* (2006.01)

(56) References Cited

U.S. PATENT DOCUMENTS

| | | | |
|---|---|---|---|
| 8,998,049 B1* | 4/2015 | Orr | B60R 11/0258 224/483 |
| 9,346,414 B1* | 5/2016 | Kuhens | B60R 11/0258 |
| 9,690,729 B2* | 6/2017 | Jolda | G06F 13/36 |
| 2004/0124317 A1* | 7/2004 | Wallaker | B60R 11/02 248/27.1 |
| 2006/0108900 A1* | 5/2006 | Lee | B60R 11/02 312/319.6 |
| 2006/0249632 A1* | 11/2006 | McKelvey | B60R 11/02 248/27.1 |
| 2007/0038434 A1* | 2/2007 | Cvetko | B60R 11/0241 703/23 |
| 2007/0132894 A1* | 6/2007 | Vitito | G06F 1/1601 348/837 |
| 2008/0180889 A1* | 7/2008 | Ozaki | G01C 21/265 361/679.01 |
| 2012/0048902 A1* | 3/2012 | Clochard | B60R 11/02 224/282 |
| 2014/0125085 A1 | 5/2014 | Wakibayashi et al. | |
| 2014/0223065 A1 | 8/2014 | Jolda et al. | |
| 2015/0214989 A1* | 7/2015 | Yeh | H04B 1/3877 455/575.1 |

FOREIGN PATENT DOCUMENTS

| | | |
|---|---|---|
| JP | 2006-123567 A | 5/2006 |
| JP | 2009-083737 A | 4/2009 |
| JP | 2012-006464 A | 1/2012 |
| JP | 2014-177148 A | 9/2014 |

* cited by examiner

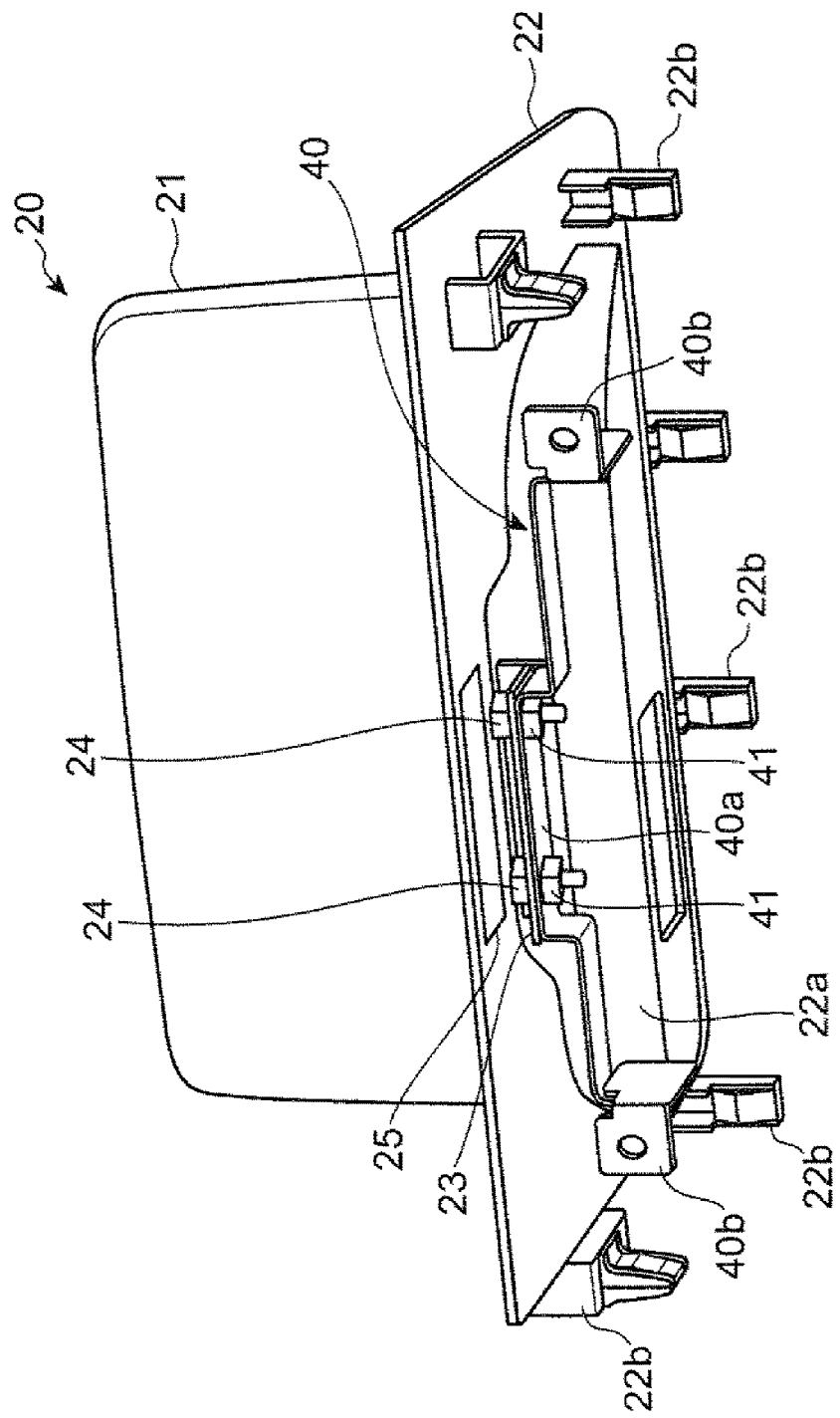

STRUCTURE FOR ATTACHING IN-VEHICLE APPARATUS

TECHNICAL FIELD

The present invention relates to a structure for attaching an in-vehicle device to a dashboard of a vehicle.

BACKGROUND ART

Each of Patent Documents 1 and 2 discloses a structure for attaching an in-vehicle device to a dashboard of a vehicle.

Specifically, according to Patent Document 1, a recess for mounting the in-vehicle device is formed at the front of the dashboard, and the in-vehicle device is attachable to and detachable from the recess from a rear in the vehicle longitudinal direction.

The structure of Patent Document 2 includes a display standing on the dashboard, and a controller fixed to the inside of the dashboard.

CITATION LIST

Patent Document

[Patent Document 1] Japanese Unexamined Patent Publication No. 2004-276812
[Patent Document 2] Japanese Unexamined Patent Publication No. 2014-177148

SUMMARY OF THE INVENTION

Technical Problem

In the structure of Patent Document 2, the display is fixed to the controller. The user needs to detach part of panels constituting the surface of the dashboard, and further detach air-conditioning ducts and other members located inside the dashboard to take the display out of the controller for maintenance or repair.

The following structure is conceivable to improve the user's convenience. A large opening is formed around a display in a member constituting the surface of a dashboard to enable the user to take out a controller upward, for example, together with the display. The opening is covered with a bezel, for example.

However, such a large opening requires a long split line between members, which largely affects the appearance of the dashboard for the occupant seated in front of the dashboard and the layout of various members of the dashboard.

The present invention aims to provide a structure for attaching an in-vehicle device, which enables a flexible design of a dashboard and improves the convenience in maintaining or repairing the in-vehicle device.

Solution to the Problem

The present application recites
a structure for attaching an in-vehicle device including a display standing on a dashboard of a vehicle, and a controller placed inside the dashboard.
The structure includes a connecting member.
The controller is fixed to the dashboard.
The controller and the display are connected together via the connecting member.
The connecting member is attachable to and detachable from the controller and the display independently.

The present application recites the structure with the following features.
The display is detachably fixed to a first fixable portion of the connecting member by a first shaft-like engaging member.
The controller is detachably fixed to a second fixable portion of the connecting member by a second shaft-like engaging member.
The first and second fixable portions are configured such that the first and second shaft-like engaging members tighten the first and second fixable portions, respectively, in different directions.

The present application recites the structure with the following features.
The first fixable portion is configured such that the first shaft-like engaging member tightens in a substantially vehicle vertical direction.
The second fixable portion is configured such that the second shaft-like engaging member tightens in a substantially vehicle longitudinal direction.

The present application recites the structure with the following features.
The dashboard includes a third fixable portion to which the controller is fixed.
The controller is detachably fixed to the third fixable portion by a third shaft-like engaging member.
The third fixable portion is configured such that the third shaft-like engaging member tightens in the substantially vehicle longitudinal or vertical direction.

The present application recites the structure with the following features.
The controller includes a controller body, and a support member fixed to an end of the controller body in a vehicle width direction.
The support member includes
a fourth fixable portion fixed to the first fixable portion of the connecting member, and
a fifth fixable portion fixed to the third fixable portion.
The fourth and fifth fixable portions are located in a substantially same position in the vehicle width direction.

The present application recites the structure with the following features.
The display includes a display body, and an attachment/detachment member fixed to the display body and to the first fixable portion of the connecting member.
The attachment/detachment member is located on a back of a display part of the display body.

The present application recites the structure with the following features.
The display includes a bezel with a surface continuous with a surface of the dashboard around the display body.
The attachment/detachment member is located below the bezel.
A portion of the bezel above the attachment/detachment member is a detachable panel.

Advantages of the Invention

According to the present application, the controller and the display are connected together via the connecting member. The connecting member is attachable to and detachable from the controller and the display independently. This allows the connecting member to be fixed only to the controller or only to the display. Thus, the connecting member can be fixed to either the controller or the display in view of the workability in attaching, maintaining, or repairing the display. This configuration provides various attachment or use of the display, which leads to flexible design of the dashboard and the user's convenience in maintaining or repairing the in-vehicle device.

According to the present application, the display is detachably fixed to the first fixable portion of the connecting member by the first shaft-like engaging member. The controller is detachably fixed to the second fixable portion of the connecting member by the second shaft-like engaging member. In this case, the first and second fixable portions are configured such that the first and second shaft-like engaging members tighten the first and second fixable portions, respectively, in different directions. With this configuration, one of the first and second shaft-like members, which tightens and loosens more easily, is selectable in attaching, maintaining, or repairing the display. The selected one is moved in the tightening direction to tighten or loosen, thereby attaching or detaching the display. That is, this configuration provides various attachment or use of the display, which leads to more flexible design of the dashboard and the user's higher convenience in maintaining or repairing the in-vehicle device.

According to the present application, the first fixable portion is configured such that the first shaft-like engaging member tightens in the substantially vehicle longitudinal direction. The second fixable portion is configured such that the second shaft-like engaging member tightens in the substantially vehicle vertical direction. With this configuration, one of the first and second shaft-like members, which tightens or loosens more easily, is selectable in attaching, maintaining, or repairing the display. The selected one is moved in the substantiallyvehicle longitudinal or vertical direction to tighten or loosen, thereby attaching or detaching the display.

According to the present application, the dashboard includes a third fixable portion to which the controller is fixed. The controller is detachably fixed to the third fixable portion by the third shaft-like engaging member. In this case, the third fixable portion is configured such that the third shaft-like engaging member tightens in the substantially vehicle longitudinal or vertical direction. In attaching, maintaining, or repairing the controller, the third shaft-like engaging member is moved in the vehicle longitudinal or vertical direction to tighten or loosen, thereby attaching or detaching the controller.

According to the present application, the controller includes the support member fixed to an end of the controller body in a vehicle width direction. The support member includes the fourth fixable portion fixed to the first fixable portion of the connecting member, and the fifth fixable portion fixed to the third fixable portion. In this case, the fourth and fifth fixable portions are located in the substantially same position in the vehicle width direction. That is, even the two fixable portions (i.e., the fourth and fifth fixable portions) do not increase the whole size of the controller in the vehicle width direction. Therefore, the display is fixed to the controller via the connecting member and the support member without increasing the mounting space in the vehicle width direction.

According to the present application, the display includes a display body, and an attachment/detachment member fixed to the display body and to the first fixable portion of the connecting member. In this case, the attachment/detachment member is located on a back of a display part of the display body. This configuration makes the attachment/detachment member invisible or hardly visible to a seat occupant(s), thereby providing the seat occupant(s) with a better view.

According to the present application, the display includes a bezel with a surface continuous with a surface of the dashboard around the display body. The attachment/detachment member is located below the bezel. In this case, a portion of the bezel above the attachment/detachment member is a detachable panel. This configuration allows the user to easily access the fixable portion between the attachment/detachment member and the connecting member by detaching the detachable panel for use.

BRIEF DESCRIPTION OF THE DRAWINGS

FIG. 5 is a perspective view of the display as viewed obliquely from bottom from the back.

FIG. 6A is viewed obliquely from above from the front of the controller. FIG. 6B is viewed obliquely from bottom from the back of the controller.

FIG. 10A illustrates that the in-vehicle device is attached. FIG. 10B illustrates that the display is being attached to the dashboard. FIG. 10C illustrates that the display is being detached from the dashboard.

DESCRIPTION OF EMBODIMENTS

A structure for attaching an in-vehicle device according to an embodiment of the present invention will now be described. Unless defined otherwise, the expressions "front," "rear," "upper," "lower," and "back" that are used in the explanation of the in-vehicle device represent "front," "rear," "upper," "lower," and "back" directions or surfaces generally used for the device to avoid redundant descriptions. For easier understanding, directional expressions may be based on a vehicle on the assumption that the device is mounted on the vehicle, even if only the device is described.

1. Configuration 1-1. Outline of Dashboard

Figure 1:
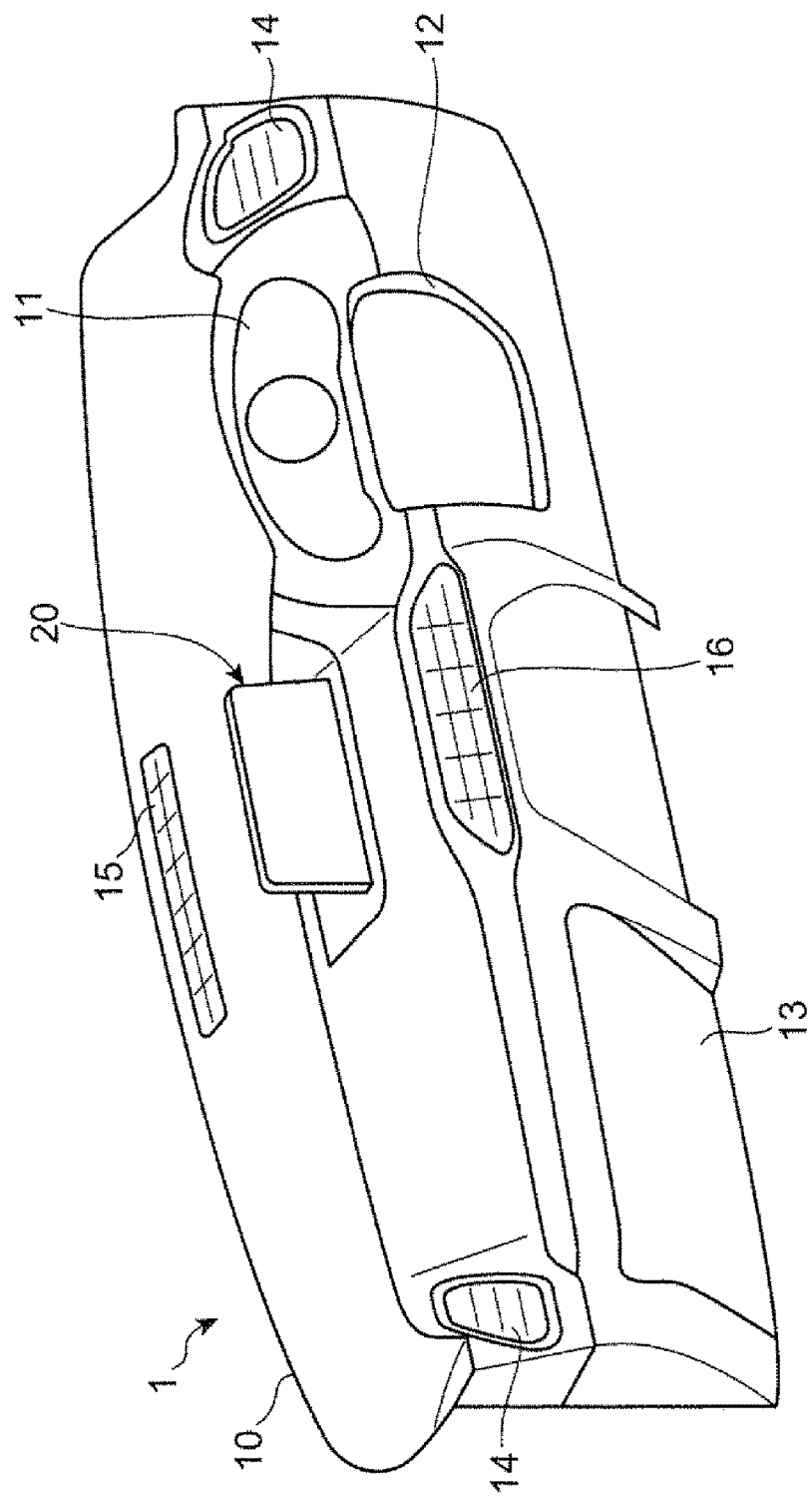
FIG. 1 is a perspective view illustrating a schematic configuration of a dashboard associated with a structure for attaching an in-vehicle device according to an embodiment of the present invention.

FIG. 1 is a perspective view illustrating a schematic configuration of a dashboard associated with a structure for attaching an in-vehicle device according to an embodiment of the present invention.

A dashboard 1 is placed at the front of the interior of a vehicle along the width of the vehicle. An instrument panel 11 including a speedometer and a fuel gauge is attached to a dashboard body 10 of the dashboard 1 in front of a driver seat when the dashboard 1 is placed in the vehicle. An opening 12 for placing a steering system including a steering wheel and a steering shaft is provided in the dashboard body 10 below the instrument panel 11.

When the dashboard 1 is placed in the vehicle, a glove compartment 13 for storing small items is provided in front of a front passenger seat.

Air conditioning vents 14 are formed at right and left ends in the vehicle width direction. Air conditioning vents 15 and 16 are formed at the center of the dashboard body 10 in the vehicle width direction.

A display 20 stands on the upper surface of the dashboard 1 at the center in the vehicle width direction. The dashboard 1 houses a controller 30 (see FIG. 2) controlling display operation of the display 20.

1-2. Outline of Display and Controller

Figure 2:
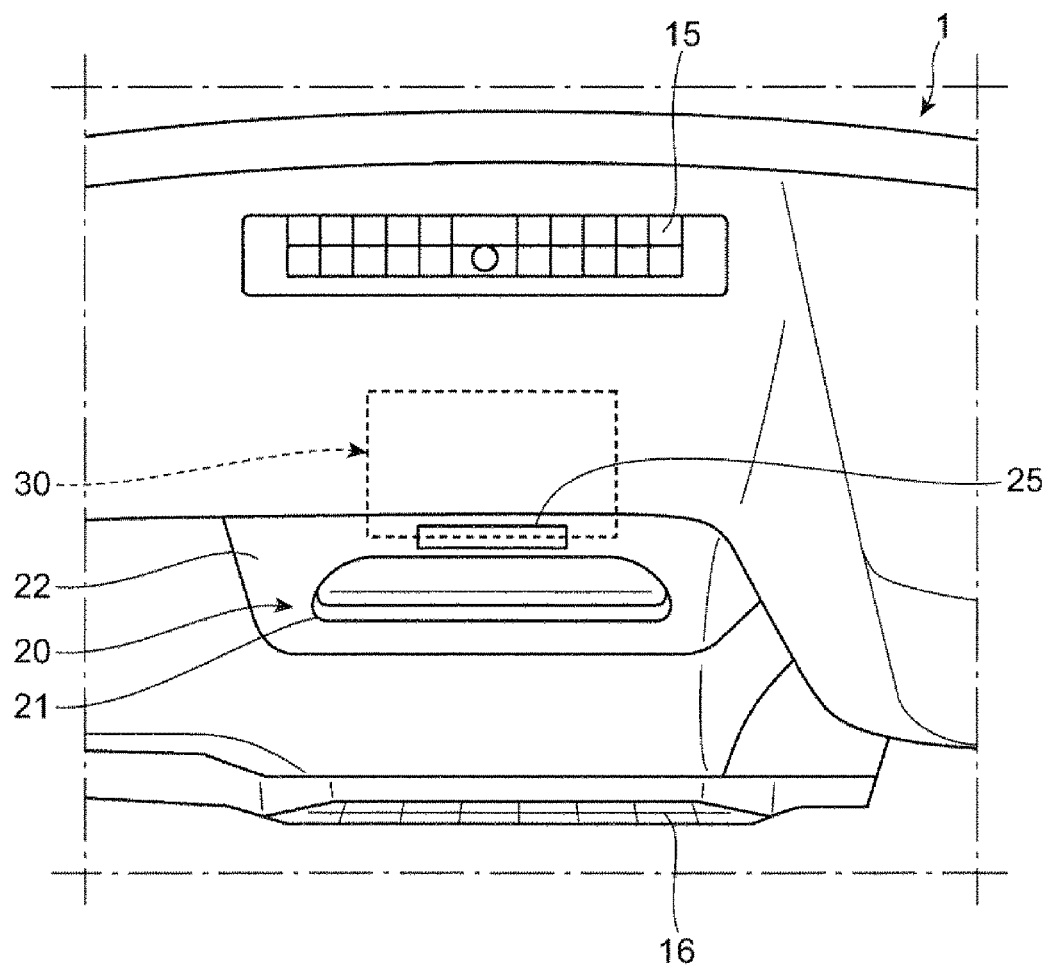
FIG. 2 is a top view of a part of the dashboard in which a display is placed as the in-vehicle device.

FIG. 2 is a top view of a part of the dashboard 1 in which the display 20 and the controller 30 are placed.

The display 20 includes a display body 21 and a bezel 22. The display body 21 includes a display part capable of displaying images. The bezel 22 is attached to the lower portion of the display body 21. A recess 10a (see FIGS. 7 and 8), in which the lower portion of the display 20 (i.e., the bezel 22) is fitted, is formed in the upper surface of the dashboard 1. The recess 10a and the bezel 22 have almost the same form in plan view. The surface of the bezel 22 is continuous with the surface of the dashboard 1 around the display body 21. The bezel 22 has a slightly larger size than the display body 21 in plan view. That is, the size of the bezel 22 is relatively smaller than the dashboard 1 in plan view. The split line between the bezel 22 and the dashboard body 10 is relatively short. An opening is formed in the bezel 22 in a position corresponding to the back of the display body 21. A detachable lid 25 is fitted to the opening.

Figure 3:
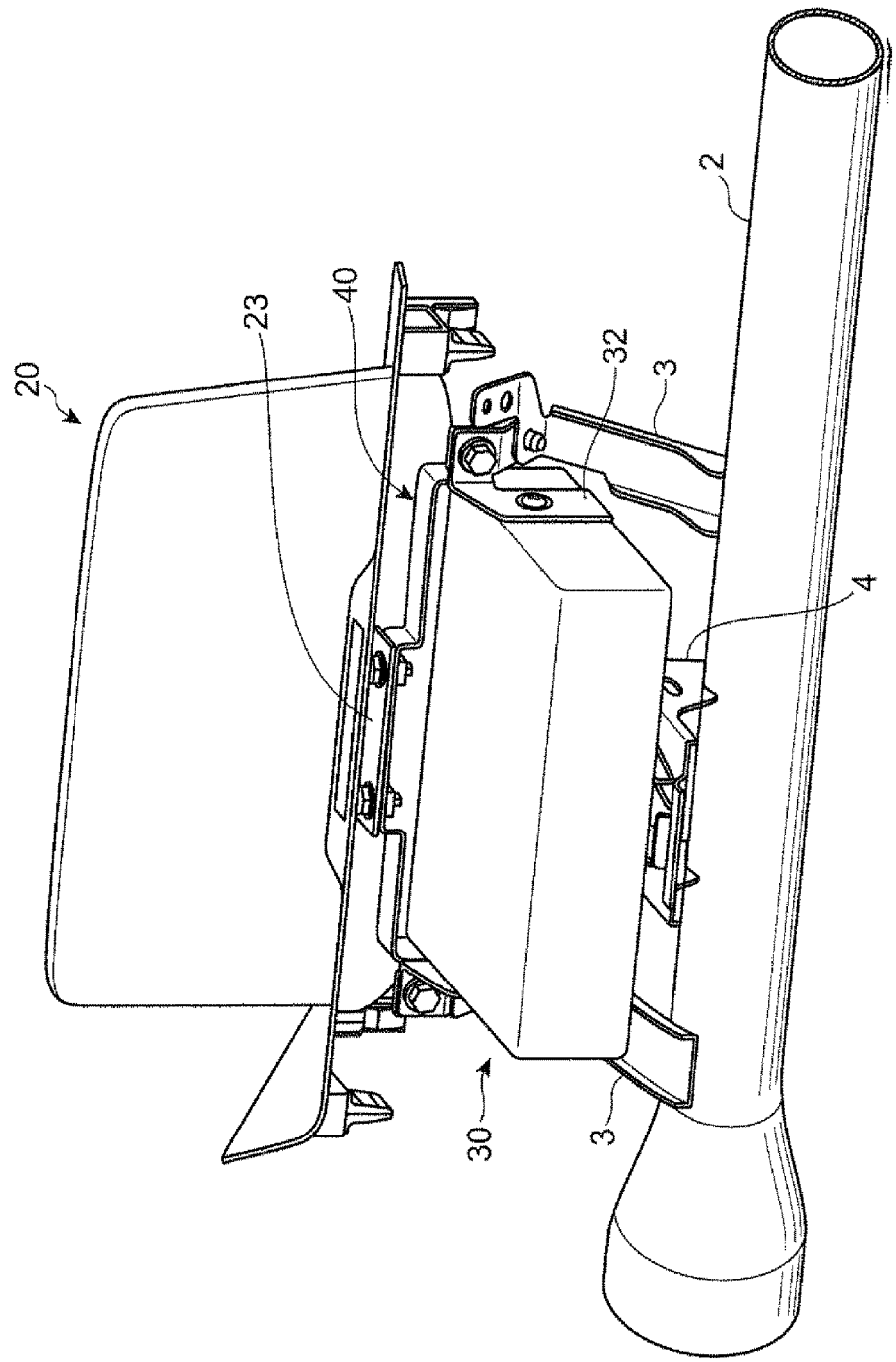
FIG. 3 is a perspective view of a structure for attaching a display and a controller to the dashboard (i.e., a dashboard member) as viewed obliquely from above from the back of the display.

FIG. 3 is a perspective view of a structure for attaching the display 20 and the controller 30 to the dashboard 1 (i.e., a dashboard member 2) as viewed obliquely from above from the back. The dashboard member 2 is a tubular member located inside the dashboard 1 and extending along the width of the vehicle. A pair of right and left first dashboard brackets 3 and a second dashboard bracket 4 are fixed to the dashboard member 2 almost at the center in the vehicle width direction. The first dashboard brackets 3 extend toward the rear of the vehicle. The controller 30 is fixed to the first and second dashboard brackets 3 and 4. The display 20 is fixed to the controller 30 via a connecting bracket 40.

Figure 4:
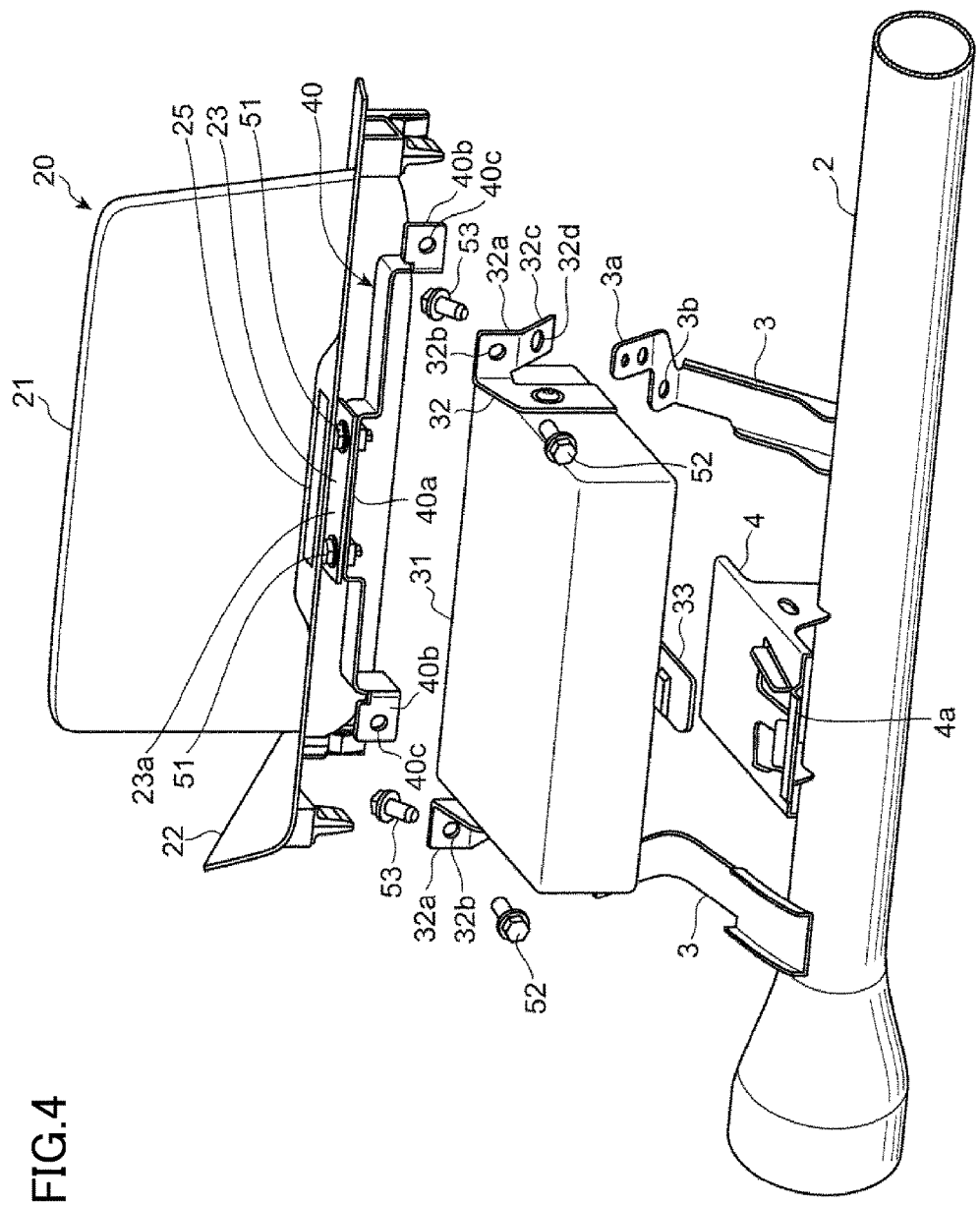
FIG. 4 is a perspective view of the structure for attaching the display and the controller to the dashboard (i.e., a dashboard member) as viewed obliquely from above from the back of the display. This figure shows members before being assembled.

FIG. 4 is a perspective view of the structure for attaching the display 20 and the controller 30 to the dashboard 1 (i.e., the dashboard member) as viewed obliquely from above from the back of the display 20. This figure shows members before being assembled. Each first dashboard bracket 3 is obtained by bending a long plate-like metal member, and includes a third fixable portion 3a at its vehicle rear side end. The third fixable portions 3a are fixed to fifth fixable portions 32c of a support bracket 32 of the controller 30. Fixed surfaces of the third fixable portions 3a face obliquely upward toward the rear of the vehicle (i.e., in the substantially vehicle longitudinal direction). Bolt holes 3b penetrate the respective fixed surfaces in this direction.

The second dashboard bracket 4 is obtained by bending a plate-like metal member into a table-like form. A mount surface on which the controller 30 is mounted faces upward in the substantially vehicle vertical direction. The second dashboard bracket 4 includes a fixable portion 4a at the front of the vehicle. The fixable portion 4a is engaged with a fixed member 33 of the controller 30.

FIG. 5 is a perspective view of the display 20 as viewed obliquely from bottom from the back. Engaging protrusions 22b protruding downward are formed on the lower surface at the edge of the bezel 22. The bezel 22 also includes a holder 22a protruding downward and containing the lower portion of the display 20.

An attachment/detachment bracket 23 is fixed to the rear surface of the holder 22a. The attachment/detachment bracket 23 is formed by bending a plate-like metal member, has an L-shaped cross-section, and includes a sixth fixable portion 23a (see FIG. 4) fixed to the connecting bracket 40. A fixed surface of the sixth fixable portion 23a faces in the substantially vehicle vertical direction. Bolt holes 23b (see FIG. 11) penetrate this fixed surface in this direction. The attachment/detachment bracket 23 is located on the back of the display part of the display body 21.

The connecting bracket 40 is obtained by bending a long plate-like metal member. As shown in FIGS. 4 and 5, the connecting bracket 40 includes a first fixable portion 40a and second fixable portions 40b at the center and both ends in the longitudinal direction (i.e., in the vehicle width direction), respectively. The first fixable portion 40a is fixed to the sixth fixable portion 23a of the attachment/detachment bracket 23. The second fixable portions 40b are fixed to the controller 30. A fixed surface of the first fixable portion 40a faces in the substantially vehicle vertical direction. Bolt holes 40d (see FIG. 11) penetrate this fixed surface in this direction so as to correspond to the bolt holes 23b of the sixth fixable portion 23a. First bolts 51 (see FIG. 4) are inserted as first shaft-like engaging members through the bolt holes 23b and 40d in the substantially vehicle vertical direction. The fixed surfaces of the second fixable portions 40b face in the substantially vehicle longitudinal direction. Bolt holes 40c penetrate the respective fixed surfaces in this direction.

Figure 6A:
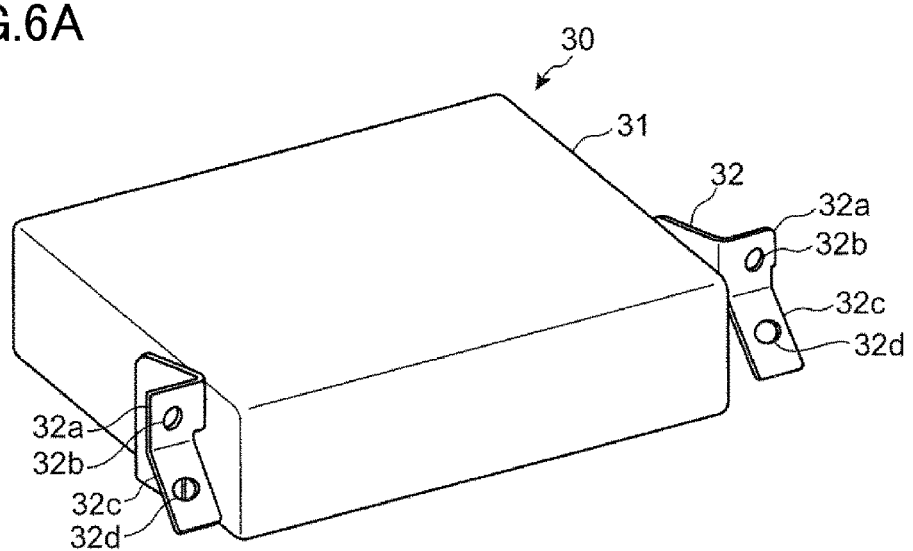
FIGS. 6A and 6B are perspective views of the controller as the in-vehicle device. Specifically.
Figure 6B:
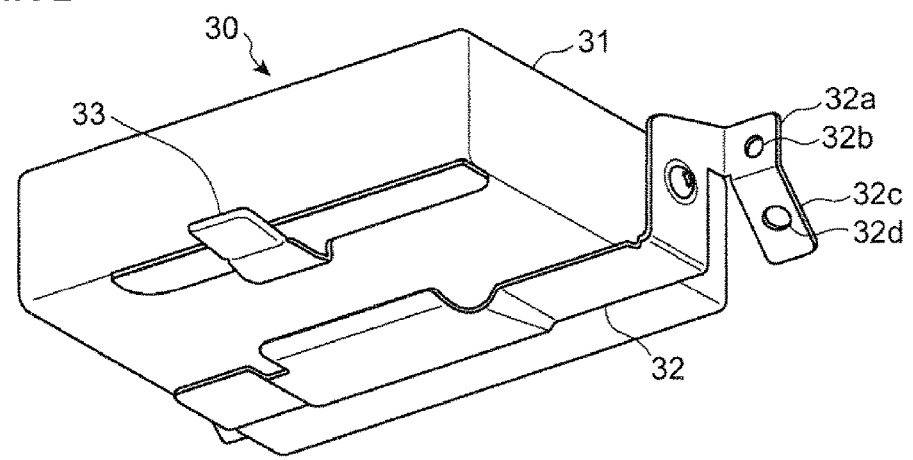

FIGS. 6A and 6B are perspective views of the controller 30 as the in-vehicle device. Specifically, FIG. 6A is the perspective view of the controller 30 as viewed from above from the front. FIG. 6B is the perspective view of the controller 30 as viewed from bottom from the back. The controller 30 includes the controller body 31, the support bracket 32, and the fixed member 33. The support bracket 32 is a plate-like member supporting the controller body 31 under the controller body 31, and is obtained by bending a long plate-like metal member. The support bracket 32 extends in the vehicle width direction and is fixed to right and left sides (ends) of the controller body 31 by screws, for example. The support bracket 32 includes fourth fixable portions 32a and fifth fixable portions 32c. The fourth fixable portions 32a are fixed to the first fixable portion 40a of the connecting bracket 40. The fifth fixable portions 32c are fixed to the respective third fixable portions 3a of the first dashboard brackets 3. The fourth and fifth fixable portions 32a and 32c are formed in the substantially same positions in the vehicle width direction. Fixed surfaces of the fourth fixable portions 32a face in the substantially vehicle longitudinal direction. Bolt holes 32*b* penetrate the respective fixed surface to correspond to the bolt holes 40*c* of the second fixable portions 40*b*. Second bolts 52 (see FIG. 4) are inserted as second shaft-like engaging members through the bolt holes 40*c* and the bolt holes 32*b* in the substantially vehicle longitudinal direction. Fixed surfaces of the fifth fixable portions 32*c* face obliquely upward toward the rear. Bolt holes 32*d* penetrate the respective fixed surfaces in this direction. The fixed member 33 is made of elastically deformable resin, and attached to the rear bottom of the controller body 31 so as to protrude rearward. The fixed member 33 is engaged with the second dashboard bracket 4.

Figure 7:
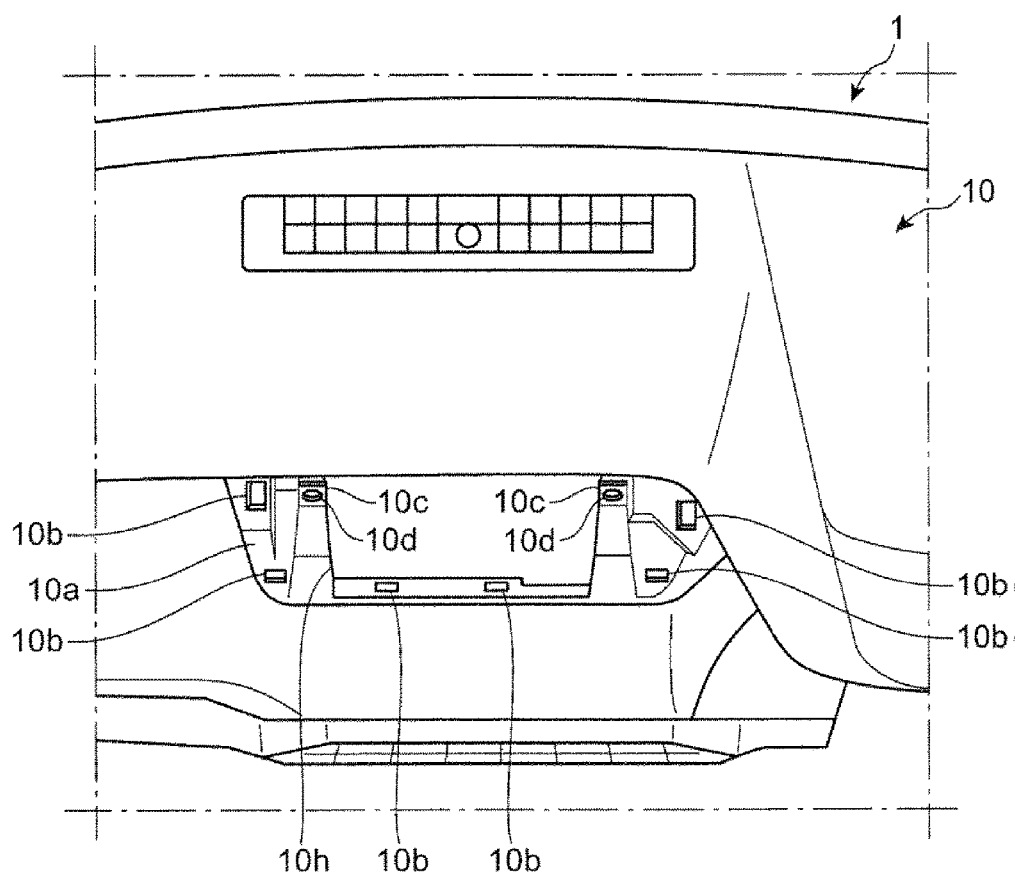
FIG. 7 is a top view corresponding to FIG. 2 and illustrating the dashboard with neither the display nor the controller attached.
Figure 8:
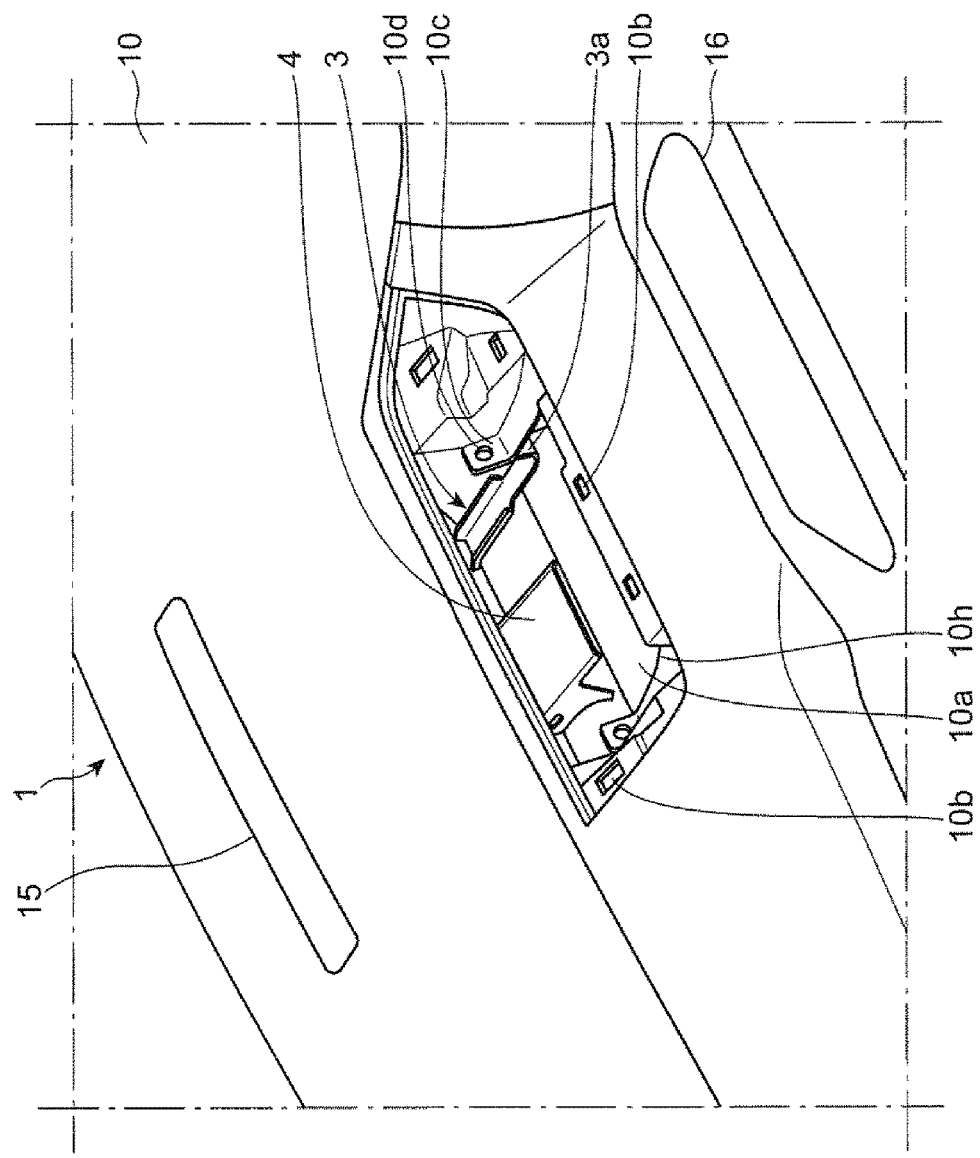
FIG. 8 is a perspective view of the dashboard, before the display and the controller are attached, as viewed obliquely from above from the rear of a vehicle.

FIG. 7 is a top view corresponding to FIG. 2 and illustrating the dashboard 1 (i.e., the dashboard body 10) with neither the display 20 nor the controller 30 attached. FIG. 8 is a perspective view of the dashboard, before the display and the controller are attached, as viewed obliquely from above from the rear of the vehicle. FIG. 7 shows that no dashboard member 2 is attached. FIG. 8 shows that the dashboard member 2 is attached. The recess 10*a* is formed in the dashboard body 10 in the position to which the display 20 is attached. An opening 10*h* is formed, at the center of the recess 10*a*, as the space for placing the controller 30. Engaging holes 10*b* and fixable portions 10*c* are provided around the opening 10*h* of the recess 10*a*. The engaging protrusions 22*b* of the bezel 22 of the display 20 are fitted in the engaging holes 10*b*. The fourth fixable portions 32*a* of the support bracket 32 of the controller 30 are fixed to the fixable portions 10*c*. A bolt hole 10*d* is formed in each of the fixable portions 10*c* to correspond to one of the bolt holes 32*b* of the support bracket 32 of the controller 30. Third bolts 53 (see FIG. 4) are inserted as third shaft-like engaging members through the bolt holes 32*d*, 10*d*, and 3*b* in the substantially vehicle longitudinal direction.

1-3. Assembly Structure

The assembly structure of the display 20 and the controller 30 using the above-identified brackets will now be described with reference to FIGS. 3 and 4. The controller 30 is mounted on a predetermined position of the second dashboard bracket 4. Third bolts 53 engage the fifth fixable portions 32*c* of the support bracket 32 of the controller 30, the third fixable portions 3*a* of the first dashboard brackets 3, and the fixable portions 10*c* of the dashboard body 10 (see FIGS. 7 and 8) together. This engagement fixes the controller 30 to the dashboard 1 (specifically, the first and second dashboard brackets 3 and 4).

The second bolts 52 engage the fourth fixable portions 32*a* of the support bracket 32 of the controller 30 and the second fixable portions 40*b* of the connecting bracket 40 together. The first bolts 51 engage the sixth fixable portion 23*a* of the attachment/detachment bracket 23 of the display 20 and the first fixable portion 40*a* of the connecting bracket 40 together. These engagements fix the display 20 to the controller 30 via the connecting bracket 40.

In this manner, in the structure for attaching an in-vehicle device according to this embodiment, the controller 30 is fixed to the dashboard 1 (specifically, the first and second dashboard brackets 3 and 4). The controller 30 and the display 20 are connected together via the connecting bracket 40. The connecting bracket 40 is attachable to and detachable from the controller 30 and the display 20 independently. This configuration allows the connecting bracket 40 to be fixed only to the controller 30 or only to the display 20. Thus, the connecting bracket 40 can be fixed to either the controller 30 or the display 20 in view of the workability in attaching, maintaining, or repairing the display 20.

In the structure for attaching an in-vehicle device according to this embodiment, the display 20 is detachably fixed to the first fixable portion 40*a* of the connecting bracket 40 by the first bolts 51. The controller 30 is detachably fixed to the second fixable portions 40*b* of the connecting bracket 40 by the second bolts 52. The first fixable portion 40*a* is configured such that the first bolts 51 tighten in the substantially vehicle vertical direction. The second fixable portions 40*b* are configured such that the second bolts 52 tighten in the substantially vehicle longitudinal direction. That is, the first and second fixable portions 40*a* and 40*b* are configured such that the first and second bolts 51 and 52 tighten the first and second fixable portions 40*a* and 40*b*, respectively, in different directions. Ones of the first and second bolts 51 and 52, which tighten (i.e., engage) or loosen (i.e., disengage) more easily, are selectable in attaching, maintaining, or repairing the display 20. The selected ones are moved in the tightening (i.e., engaging) direction to tighten or loosen, thereby attaching or detaching the display 20.

In the structure for attaching an in-vehicle device according to this embodiment, the dashboard 1 includes the third fixable portions 3*a* to which the controller 30 is fixed. The controller 30 is detachably fixed to the third fixable portions 3*a* by the third bolts 53. The third fixable portions 3*a* are configured such that the third bolts 53 tighten in the substantially vehicle longitudinal direction. In attaching, maintaining, or repairing the controller 30, the third bolts 53 are moved in the vehicle longitudinal direction to tighten or loosen, thereby attaching or detaching the controller 30.

2. Attachment of Display and Controller to Dashboard

Figure 9A:
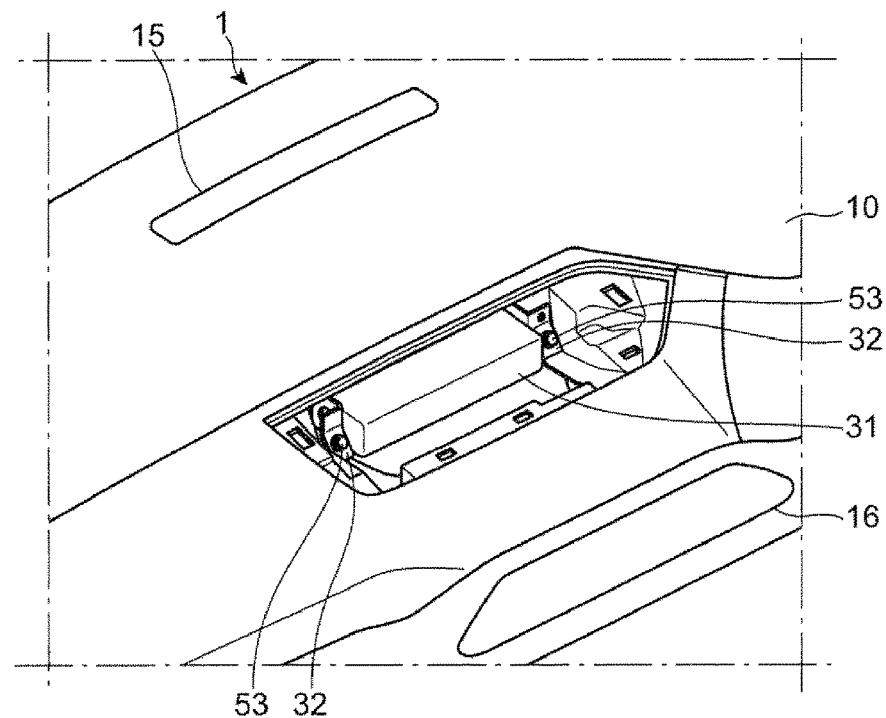
FIG. 9A is a perspective view of the dashboard without the display attached, as viewed obliquely from above from the rear of the vehicle.

Attachment of the display 20 and the controller 30 to the dashboard 1 will now be described with reference to the above-described FIGS. 4 and 8, as well as FIGS. 9A and 9B, for example. FIG. 8 is the perspective view of the dashboard 1, before the display 20 and the controller 30 are attached, as viewed obliquely from above from the rear of the vehicle. FIG. 9A is a perspective view of the dashboard 1 without the display 20 attached, as viewed obliquely from above from the rear of the vehicle. As shown in FIG. 8, before the display 20 and the controller 30 are attached, the first and second dashboard brackets 3 and 4 are exposed through the opening 10*h* of the dashboard body 10.

Figure 10A:
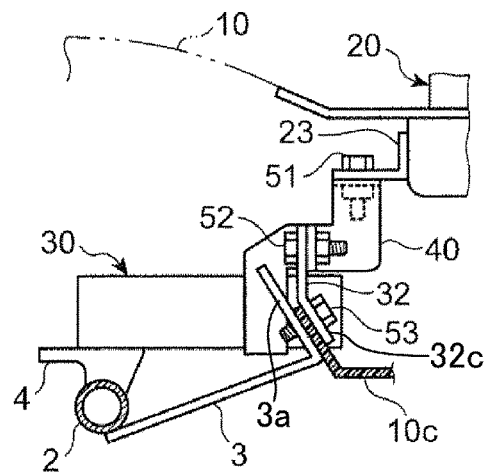
FIGS. 10A-10C are schematic side views of the structure for attaching an in-vehicle device.
Figure 10B:
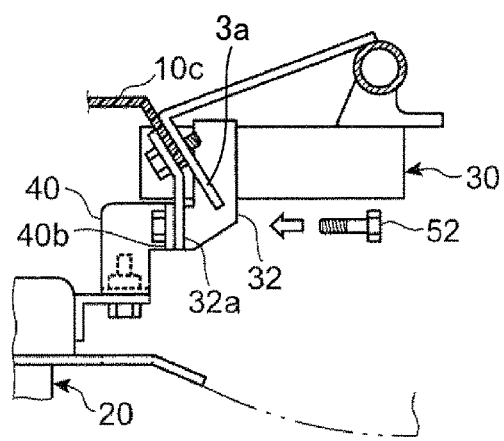
Figure 10C:
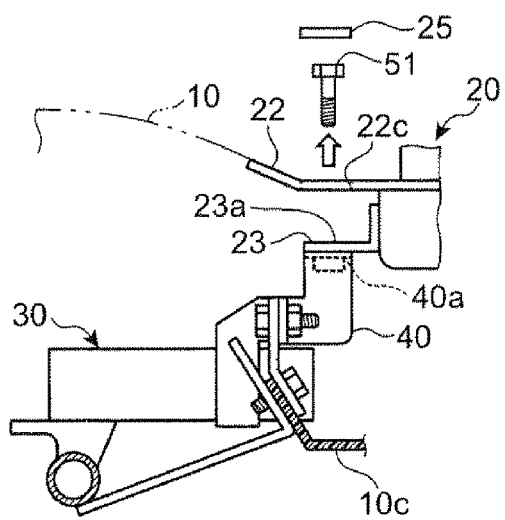

First, as shown in FIG. 9A, the controller 30 is inserted into the opening 10*h* of the recess 10*a* of the dashboard body 10 and mounted on the second dashboard bracket 4. As is clear from the comparison between FIGS. 8 and 9A and as shown in FIG. 10A, the fifth fixable portions 32*c* of the support bracket 32 of the controller 30 overlap the surfaces of the fixable portions 10*c* of the dashboard body 10 facing the inside (i.e., the rear) of the vehicle. As also shown in FIG. 10B, the surfaces of the fixable portions 10*c* of the dashboard body 10 facing the outside (i.e., the front) of the vehicle overlap the third fixable portions 3*a* of the first dashboard brackets 3. FIGS. 10A-10C are schematic side views of the structure for attaching an in-vehicle device. Specifically, FIG. 10A illustrates that the in-vehicle device is attached. FIG. 10B illustrates that the display 20 is being attached to the dashboard 1. FIG. 10C illustrates that the display 20 is being detached from the dashboard 1. The third bolts 53 are inserted into the bolt holes of the fixable portions from the rear of the vehicle, with the three types of fixable portions overlapping each other, to engage these fixable portions.

Figure 9B:
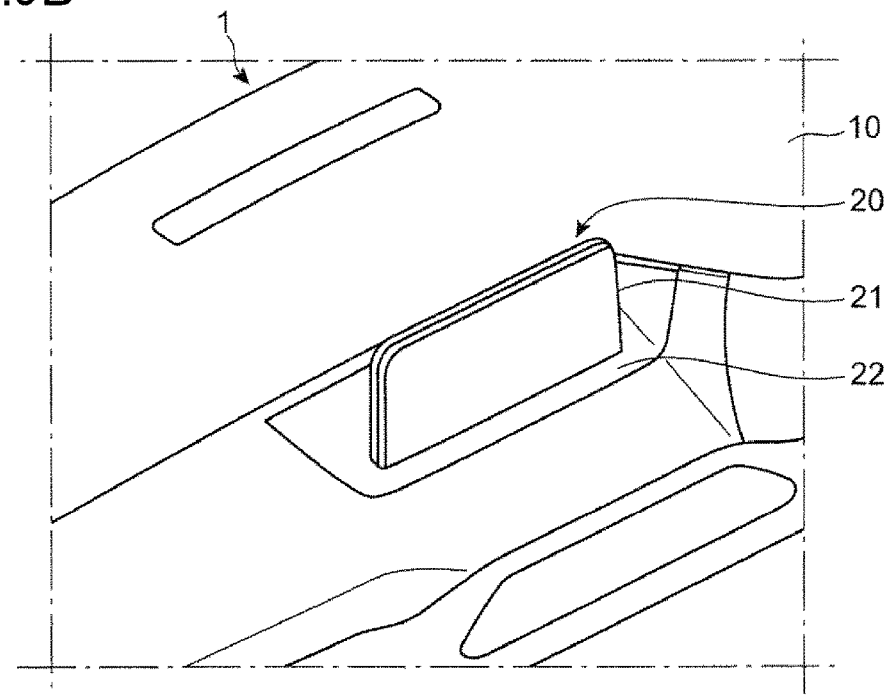
FIG. 9B is a perspective view of the dashboard with the display and the controller attached, as viewed obliquely from above from the rear of the vehicle.

Then, as shown in FIG. 9B, the display 20 with the connecting bracket 40 attached in advance is attached to the recess 10*a* of the dashboard body 10. At this time, the engaging protrusions 22*b* of the bezel 22 shown in FIG. 5 are engaged with the engaging holes 10b of the recess 10a of the dashboard body 10 shown in FIG. 7. As shown in FIG. 10B, the second fixable portions 40b of the connecting bracket 40 face the fourth fixable portions 32a of the support bracket 32. The engagement between the engaging protrusions 22b and the engaging holes 10b has such strength that a worker for assembly easily releases the engagement simply by lifting the display 20 but cannot release the engagement by rotating the dashboard body 10 around the rotation axis parallel to the vehicle width direction in assembling the dashboard 1.

Next, as shown in FIG. 10B, the dashboard body 10 is rotated 180 degrees around the rotation axis parallel to the vehicle width direction so that the upper surface of the dashboard body 10 faces downward, that is, the lower surface (i.e., the inner surface) of the dashboard body 10 faces upward. In this state, the second bolts 52 are inserted into the bolt holes 40c of the second fixable portions 40b of the connecting bracket 40 and the bolt holes 32b of the fourth fixable portions 32a of the support bracket 32 from the back of the dashboard 1 to engage the second fixable portions 40b of the connecting bracket 40 with the fourth fixable portions 32a of the support bracket 32. The reason why the dashboard body 10 is rotated 180 degrees around the rotation axis parallel to the vehicle width direction in this engagement will now be described. The dashboard 1 is typically assembled in an exclusive sub-line before being mounted on the vehicle. In that case, the worker may have difficulty in the engagement using the second bolts 52 from the front or top of the dashboard 1 due to the positional relationship between the dashboard 1 and the worker. The 180-degree rotation of the dashboard body 10 facilitates the worker's engagement using the second bolts 52.

After that, as described above, with the lower surface (the inner surface) of the dashboard body 10 facing upward, signal cables (not shown) are connected between the display 20 and the controller 30. With this connection, the attachment of the display 20 and the controller 30 to the dashboard 1 is completed.

3. Detachment of Display and Controller from Dashboard

For inspection or repair of the display 20 and the controller 30 due to malfunction or other concerns, detachment of the display 20 and the controller 30 may be necessary. Detachment of the display 20 and the controller 30 from the dashboard 1 will now be described.

If detachment of the display 20 is necessary, the lid 25 is detached from the bezel 22 as shown in FIG. 10C. Then, the attachment/detachment bracket 23 and the first bolts 51 are exposed through an opening 22c of the bezel 22.

Next, the first bolts 51 are unscrewed to release the engagement between the sixth fixable portion 23a of the attachment/detachment bracket 23 and the first fixable portion 40a of the connecting bracket 40 via the first bolts 51.

Figure 11:
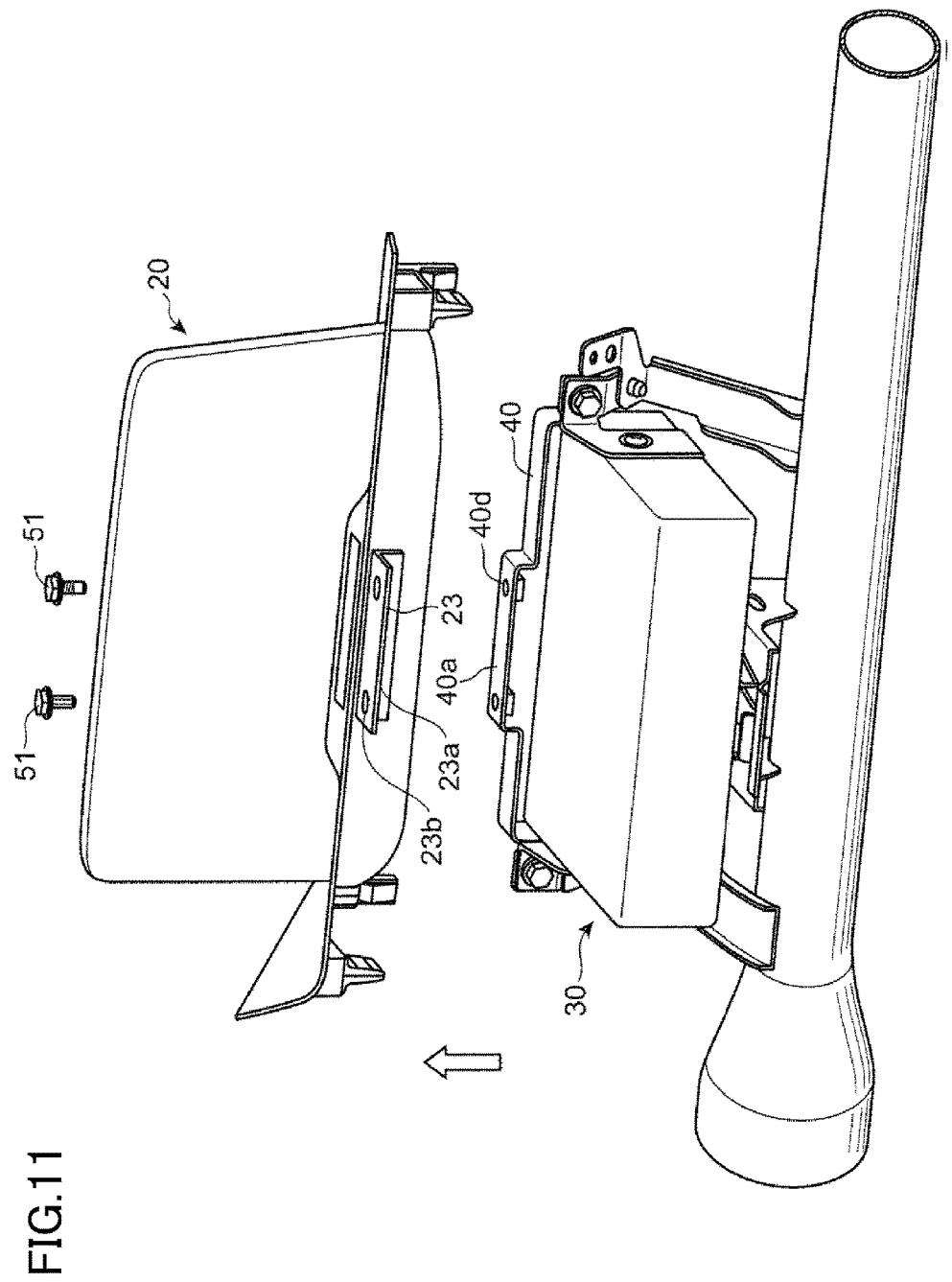
FIG. 11 is a perspective view of the controller and the display attached to the dashboard (i.e., the dashboard member) as viewed obliquely from above from the back.

After that, lifting force is applied to the display 20 to release the engagement between the engaging protrusions 22b of the bezel 22 of the display 20 and the engaging holes 10b of the dashboard body 10. In addition, as shown in FIG. 11, the display 20 is lifted. Accordingly, the display 20 is extracted, that is, not attached to the dashboard 1 as shown in FIG. 9A.

Furthermore, if detachment of the controller 30 is necessary, the third bolts 53 are unscrewed to release the engagement among the fifth fixable portions 32c of the support bracket 32 of the controller 30, the fixable portions 10c of the dashboard body 10, and the third fixable portions 3a of the first dashboard brackets 3. At this time, the connecting bracket 40 remains fixed to the third fixable portions 3a of the support bracket 32 of the controller 30 by the second bolts 52.

Next, the controller 30 is drawn toward the rear of the vehicle (i.e., the front of the dashboard 1) and taken out of the dashboard 1.

In this manner, the structure for attaching an in-vehicle device according to this embodiment allows the user to take only the display 20 out of the dashboard 1 for maintenance or repair of the display 20. At this time, the controller 30 and heads of the third bolts 53 fixing the controller 30 are exposed outside. Thus, the engagement using the third bolts 53 can be released from the front of the dashboard 1, and the controller 30 can be taken out from the front of the dashboard 1. As a result, in the structure for attaching an in-vehicle device according to this embodiment, there is no need to place additional detachable members in the dashboard body 10 around the display 20.

4. Conclusion

The structure for attaching an in-vehicle device according to this embodiment has the following configurations and features.

The structure according to this embodiment is for attaching an in-vehicle device including the display 20 standing on the dashboard 1 of the vehicle, and the controller 30 placed inside the dashboard 1.

The structure includes the connecting bracket 40.

The controller 30 is fixed to the dashboard 1.

The controller 30 and the display 20 are connected together via the connecting bracket 40.

The connecting bracket 40 is attachable to and detachable from the controller 30 and the display 20 independently.

In the structure for attaching an in-vehicle device according to this embodiment, the controller 30 and the display 20 are connected via the connecting bracket 40. The connecting bracket 40 is attachable to and detachable from the controller 30 and the display 20 independently. This configuration allows the connecting bracket 40 to be fixed only to the controller 30, or only to the display 20. Thus, the connecting bracket 40 can be fixed to either the controller 30 or the display 20 in view of the workability in attaching, maintaining, or repairing the display 20. That is, this configuration provides various attachment or use of the display 20, which leads to flexible design of the dashboard 1 and the user's convenience in maintaining or repairing the in-vehicle device.

In the structure for attaching an in-vehicle device according to this embodiment, the display 20 is detachably fixed to the first fixable portion 40a of the connecting bracket 40 by the first bolts 51.

The controller 30 is detachably fixed to the second fixable portions 40b of the connecting bracket 40 by the second bolts 52.

The first and second fixable portions 40a and 40b are configured such that the first and second bolts 51 and 52 tighten the first and second fixable portions 40a and 40b, respectively, in different directions.

In the structure for attaching an in-vehicle device according to this embodiment, ones of the first and second bolts 51 and 52, which tighten (engage) or loosen (disengage) more easily, are selectable in attaching, maintaining, or repairing the display 20. The selected ones are moved in the tightening (engaging) direction to tighten or loosen, thereby attaching or detaching the display 20. That is, this configuration provides various attachment or use of the display 20, which leads to more flexible design of the dashboard 1 and the user's higher convenience in maintaining or repairing the in-vehicle device.

In the structure for attaching an in-vehicle device according to this embodiment, the first fixable portion 40a is configured such that the first bolts 51 tighten in the substantially vehicle vertical direction.

The second fixable portions 40b are configured such that the second bolts 52 tighten in the substantially vehicle longitudinal direction.

In the structure for attaching an in-vehicle device according to this embodiment, ones of the first and second bolts 51 and 52, which tighten or loosen more easily, are selectable in attaching, maintaining, or repairing the display 20. The selected ones are moved in the substantially vehicle longitudinal or vertical direction to tighten or loosen, thereby attaching or detaching the display 20.

In the structure for attaching an in-vehicle device according to this embodiment, the dashboard 1 includes the third fixable portion 3a to which the controller 30 is fixed.

The controller 30 is detachably fixed to the third fixable portions 3a by the third bolts 53.

The third fixable portions 3a are configured such that the third bolts 53 tighten in the substantially vehicle longitudinal or vertical direction.

In the structure for attaching an in-vehicle device according to this embodiment, in attaching, maintaining, or repairing the controller 30, the third bolts 53 are moved in the substantially vehicle longitudinal or vertical direction to tighten or loosen, thereby attaching or detaching the controller 30.

In the structure for attaching an in-vehicle device according to this embodiment, the controller 30 includes the controller body 31, and the support bracket 32 fixed to the end of the controller body 31 in the vehicle width direction.

The support bracket 32 includes the fourth fixable portions 32a to be fixed to the first fixable portion 40a of the connecting bracket 40, and the fifth fixable portions 32c to be fixed to the third fixable portions 3a.

The fourth and fifth fixable portions 32a and 32c are located in a substantially same position in the vehicle width direction.

In the structure for attaching an in-vehicle device according to this embodiment, even the two types of fixable portions of the fourth and fifth fixable portions 32a and 32c do not increase the whole size of the controller 30 in the vehicle width direction. Therefore, the display 20 is fixed to the controller 30 via the connecting bracket 40 and the support bracket 32 without increasing the mounting space in the vehicle width direction.

In the structure for attaching an in-vehicle device according to this embodiment, the display 20 includes the display body 21, and the attachment/detachment bracket 23 fixed to the display body 21 and to the first fixable portion 40a of the connecting bracket 40.

The attachment/detachment bracket 23 is located on the back of the display body 21.

The structure for attaching an in-vehicle device according to this embodiment makes the attachment/detachment bracket 23 invisible or hardly visible to a seat occupant(s), thereby providing the seat occupant(s) a better view.

In the structure for attaching an in-vehicle device according to this embodiment, the display 20 includes the bezel 22 with the surface continuous with the surface of the dashboard 1 around the display body 21.

The attachment/detachment bracket 23 is located below the bezel 22.

A portion of the bezel 22 above the attachment/detachment bracket 23 is the detachable lid 25.

The structure for attaching an in-vehicle device according to this embodiment allows the user to easily access the fixable portion between the attachment/detachment bracket 23 and the connecting bracket 40 in maintaining or repairing the display by detaching the lid 25.

Other Embodiments

In the embodiment described above, the first, second, and third bolts 51, 52, and 53 represent the first, second, and third shaft-like engaging members of the present invention, respectively. However, the first, second, and third shaft-like engaging member are not necessarily bolts but may be shaft-like clips, for example.

In the embodiment described above, the first fixable portion is configured such that the first shaft-like engaging member tightens in the substantially vehicle vertical direction. The second fixable portion is configured such that the second shaft-like engaging member tightens in the substantially vehicle longitudinal direction. The present invention is also applicable to other cases. For example, the first fixable portion may be configured such that the first shaft-like engaging member tightens in the substantially vehicle longitudinal direction. The second fixable portion may be configured such that the second shaft-like engaging member tightens in the substantially vehicle vertical direction. In each case, the shaft-like engaging members may tighten obliquely upward or downward in the vehicle longitudinal direction. Alternatively, the shaft-like engaging members may tighten obliquely inward or outward in the vehicle width direction. In short, according to the present invention, the first and second fixable portions only need to be configured such that the first and second shaft-like engaging members tighten the first and second fixable portions in different directions. In addition, the connecting member only needs to be attachable to and detachable from the controller and the display independently.

INDUSTRIAL APPLICABILITY

The structure for attaching an in-vehicle device according to the present invention is widely useful for a vehicle including a display standing on a dashboard and a controller placed inside the dashboard.

DESCRIPTION OF REFERENCE CHARACTERS

1 Dashboard
3a Third Fixable Portion
20 Display
21 Display Body
22 Bezel
23 Attachment/Detachment Bracket (Attachment/Detachment Member)
23a Sixth Fixable Portion
25 Lid (Detachable Panel)
30 Controller
31 Controller Body
32 Support Bracket (Support Member)
32a Fourth Fixable Portion
32c Fifth Fixable Portion
40 Connecting Bracket (Connecting Member)

40a First Fixable portion
40b Second Fixable Portion
51 First Bolt (First Shaft-Like Engaging Member)
52 Second Bolt (Second Shaft-Like Engaging Member)
53 Third Bolt (Third Shaft-Like Engaging Member)

The invention claimed is:

1. A structure for attaching an in-vehicle device including a display standing on a dashboard of a vehicle, and a controller placed inside the dashboard, the structure comprising a connecting member, wherein
the controller is fixed to the dashboard,
the controller and the display are connected together via the connecting member,
the connecting member is attachable to and detachable from the controller and the display independently,
the display is detachably fixed to a first fixable portion of the connecting member by a first shaft-like engaging member,
the controller is detachably fixed to a second fixable portion of the connecting member by a second shaft-like engaging member,
the first and second fixable portions are configured such that the first and second shaft-like engaging members tighten the first and second fixable portions, respectively, in different directions,
the display includes
a display body, and
an attachment/detachment member fixed to the display body and to the first fixable portion of the connecting member,
the attachment/detachment member is located on a back of a display part of the display body,
the display includes a bezel with a surface continuous with a surface of the dashboard around the display body, and
the attachment/detachment member is located below the bezel,
a portion of the bezel above the attachment/detachment member is a detachable panel,
each of the first and second shaft-like engaging members is a bolt corresponding to a nut,
the bezel is fixed to a lower portion of the display body,
an opening is formed in a portion of the bezel above the attachment/detachment member,
the detachable panel is fitted into the opening, and
the opening faces the first fixable portion of the connecting member in a vertical direction.

2. The structure of claim 1, wherein
the first fixable portion is configured such that the first shaft-like engaging member tightens in a substantially vehicle vertical direction, and
the second fixable portion is configured such that the second shaft-like engaging member tightens in a substantially vehicle longitudinal direction.

3. A structure for attaching an in-vehicle device including a display standing on a dashboard of a vehicle, and a controller placed inside the dashboard, the structure comprising a connecting member, wherein
the controller is fixed to the dashboard,
the controller and the display are connected together via the connecting member,
the connecting member is attachable to and detachable from the controller and the display independently,
the display is detachably fixed to a first fixable portion of the connecting member by a first shaft-like engaging member,
the controller is detachably fixed to a second fixable portion of the connecting member by a second shaft-like engaging member,
the first and second fixable portions are configured such that the first and second shaft-like engaging members tighten the first and second fixable portions, respectively, in different directions,
the display includes
a display body, and
an attachment/detachment member fixed to the display body and to the first fixable portion of the connecting member,
the attachment/detachment member is located on a back of a display part of the display body,
the display includes a bezel with a surface continuous with a surface of the dashboard around the display body,
the attachment/detachment member is located below the bezel, and
a portion of the bezel above the attachment/detachment member is a detachable panel,
the first fixable portion is configured such that the first shaft-like engaging member tightens in a substantially vehicle vertical direction, and
the second fixable portion is configured such that the second shaft-like engaging member tightens in a substantially vehicle longitudinal direction,
the dashboard includes a third fixable portion to which the controller is fixed,
the controller is detachably fixed to the third fixable portion by a third shaft-like engaging member, and
the third fixable portion is configured such that the third shaft-like engaging member tightens in the substantially vehicle longitudinal or vertical direction.

4. The structure of claim 3, wherein
the controller includes
a controller body, and
a support member fixed to an end of the controller body in a vehicle width direction,
the support member includes
a fourth fixable portion fixed to the first fixable portion of the connecting member, and
a fifth fixable portion fixed to the third fixable portion, and
the fourth and fifth fixable portions are located in a substantially same position in the vehicle width direction.

5. A structure for attaching an in-vehicle device including a display standing on a dashboard of a vehicle, and a controller placed inside the dashboard, the structure comprising a connecting member, wherein
the controller is fixed to the dashboard,
the controller and the display are connected together via the connecting member,
the connecting member is attachable to and detachable from the controller and the display independently,
the display is detachably fixed to a first fixable portion of the connecting member by a first shaft-like engaging member,
the controller is detachably fixed to a second fixable portion of the connecting member by a second shaft-like engaging member,
the dashboard includes a third fixable portion to which the controller is fixed,
the controller is detachably fixed to the third fixable portion by a third shaft-like engaging member, the first fixable portion is configured such that the first shaft-like engaging member tightens in a substantially vehicle vertical direction, the second fixable portion is configured such that the second shaft-like engaging member tightens in a substantially vehicle longitudinal direction, the third fixable portion is configured such that the third shaft-like engaging member tightens in the substantially vehicle longitudinal or vertical direction, the controller includes
- a controller body, and
- a support member fixed to an end of the controller a vehicle width direction, the support member includes
- a fourth fixable portion fixed to the first fixable portion of the connecting member, and
- a fifth fixable portion fixed to the third fixable portion, and the fourth and fifth fixable portions are located in a substantially same position in the vehicle width direction.

6. The structure of claim 5, wherein
the display includes
- a display body, and
- an attachment/detachment member fixed to the display body and to the first fixable portion of the connecting member, and the attachment/detachment member is located on a back of a display part of the display body.

\* \* \* \* \*